US007725304B1

(12) United States Patent  
Beausoleil et al.

(10) Patent No.: US 7,725,304 B1
(45) Date of Patent: May 25, 2010

(54) METHOD AND APPARATUS FOR COUPLING DATA BETWEEN DISCRETE PROCESSOR BASED EMULATION INTEGRATED CHIPS

(75) Inventors: William F. Beausoleil, Hopewell Junction, NY (US); Beshara G. Elmufdi, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 925 days.

(21) Appl. No.: 11/438,628

(22) Filed: May 22, 2006

(51) Int. Cl.
G06F 9/455 (2006.01)
(52) U.S. Cl. .............................. 703/23; 716/5; 712/11
(58) Field of Classification Search ............. 703/23–28, 703/14; 716/1, 18, 5, 17; 709/250; 714/30; 712/11, 38
See application file for complete search history.

(56) References Cited

U.S. PATENT DOCUMENTS

| 5,943,490 | A * | 8/1999 | Sample ..................... 703/28 |
| 6,289,494 | B1 * | 9/2001 | Sample et al. ............... 716/12 |
| 6,618,698 | B1 | 9/2003 | Beausoleil et al. |
| 2002/0091507 | A1 * | 7/2002 | Tseng ....................... 703/24 |
| 2003/0074178 | A1 * | 4/2003 | Sample et al. ............... 703/25 |
| 2003/0154458 | A1 * | 8/2003 | Butts et al. ................. 716/17 |
| 2004/0249623 | A1 * | 12/2004 | Selvidge et al. ............. 703/23 |
| 2005/0028127 | A1 * | 2/2005 | Mauersberger ............. 716/18 |
| 2005/0171756 | A1 * | 8/2005 | Gooding et al. ............. 703/23 |
| 2005/0267732 | A1 * | 12/2005 | Beausoleil et al. ........... 703/28 |
| 2006/0059387 | A1 * | 3/2006 | Swoboda et al. ............ 714/30 |
| 2006/0117274 | A1 * | 6/2006 | Tseng et al. ................. 716/1 |
| 2006/0161419 | A1 * | 7/2006 | Herrell et al. ............... 703/26 |
| 2006/0190237 | A1 * | 8/2006 | Beausoleil et al. ........... 703/23 |
| 2006/0195311 | A1 * | 8/2006 | Swoboda et al. ............ 703/26 |
| 2006/0212679 | A1 * | 9/2006 | Alfano et al. ............... 712/38 |
| 2007/0067150 | A1 * | 3/2007 | Musselman ................ 703/14 |
| 2007/0179772 | A1 * | 8/2007 | Beausoleil et al. ........... 703/24 |
| 2007/0198241 | A1 * | 8/2007 | Beausoleil et al. ........... 703/23 |
| 2007/0198809 | A1 * | 8/2007 | Beausoleil et al. ........... 712/11 |
| 2007/0239422 | A1 * | 10/2007 | Bershteyn et al. ........... 703/28 |
| 2007/0266179 | A1 * | 11/2007 | Chavan et al. .............. 709/250 |

OTHER PUBLICATIONS

Yazdanshenas et al., "CAD tools and algorithms of processor-based logic emulators", University of Windsor, Oct. 2005.*

* cited by examiner

Primary Examiner—Paul L Rodriguez
(74) Attorney, Agent, or Firm—Moser IP Law Group

(57) ABSTRACT

A method and apparatus for coupling data between discrete processor-based emulation chips is described. The apparatus is a processor-based hardware emulation integrated circuits (chips) element comprising a plurality of discrete hardware emulation chips, each emulation chip coupled to another emulation chip by a crossbar for coupling data between the plurality of chips. The method comprises providing data to a crossbar from a first discrete emulation chip, selecting the data from the crossbar using a discrete second emulation chip, and storing the data in a data array in the second discrete emulation chip.

20 Claims, 5 Drawing Sheets

METHOD AND APPARATUS FOR COUPLING DATA BETWEEN DISCRETE PROCESSOR BASED EMULATION INTEGRATED CHIPS

BACKGROUND OF THE INVENTION

1. Field of the Invention

Embodiments of the present invention generally relate to processor-based emulation integrated circuits, and more particularly, to a method and apparatus for coupling data between processor-based emulation integrated circuits.

2. Description of the Related Art

Hardware emulators are programmable devices used in the verification of hardware designs. A common method of hardware design verification uses processor-based hardware emulators to emulate the design. These processor-based emulators sequentially evaluate combinatorial logic levels, starting at the inputs and proceeding to the outputs. Each pass through the entire set of logic levels is known as a cycle; the evaluation of each individual logic level is known as an emulation step.

An exemplary hardware emulator is described in commonly assigned U.S. Pat. No. 6,618,698 titled "Clustered Processors In An Emulation Engine", which is hereby incorporated by reference in its entirety. Hardware emulators allow engineers and hardware designers to test and verify the operation of an integrated circuit, an entire board of integrated circuits, or an entire system without having to first physically fabricate the hardware.

A hardware emulator generally comprises a computer workstation for providing emulation support facilities, i.e., emulation software, a compiler, and a graphical user interface to allow a person to program the emulator, and an emulation engine for performing the emulation. The emulation engine is comprised of at least one emulation board, and each emulation board contains individual emulation circuits. Each individual emulation circuit contains multiple emulation processors, and each emulation processor is capable of mimicking a logic gate. Thus, the hierarchy of the emulation engine is an emulation board, multiple emulation integrated circuits, and multiple processors that are part of each emulation integrated circuit.

Processors within an emulation integrated circuit (also referred to herein as emulation chips) are connected to each other via a shared memory known as a data array. These interconnected processors are sometimes referred to as a cluster of processors. Each processor within the cluster can access the output of any other processor, and can also access any output that is available in the data array.

Emulation chips, typically integrated circuits, on an emulation board are capable of communicating with each other via signal wires between each chip. Emulation chips can only communicate with other emulation chips, and can only receive data currently transmitted from another emulation chip, i.e., the emulation chip receiving the data does not have full access to all of the data within the emulation chip transmitting the data. Thus, communication between emulation chips is not as efficient as communication between processors within an emulation chip because extra emulation steps, i.e., requesting data from another chip, the other chip fetching the requested data, transmitting the requested data to the chip that requested the data, and finally processing the requested data, are required Emulation boards are only capable of communicating with another emulation board via a cable connector. Communication between emulation boards is less efficient than communication between emulation chips. The cable connector typically connects two emulation chips, one emulation chip on each emulation board that is joined by the cable connector. Sharing data between emulation boards requires routing the data to be shared from an emulation chip to the emulation chip connected to the cable connector. The cable connector then provides the data to the emulation chip on the other board that is also connected to the cable connector. The emulation chip on the other board can then share the data with the other emulation chips on that emulation board. The process of sharing data between emulation boards requires coordination between both emulation boards, and also between emulation chips. The entire process of sharing data between emulation boards generally requires more emulation steps than is required to share data between emulation chips and hence is less efficient than communication between emulation chips.

The computation efficiency of the emulation engine may be increased by increasing the number of processors within an emulation chips. As the number of processors within the emulation chip increases, the size and the cost of the emulation chip increases. Larger emulation chips that contain more processors are more expensive to manufacture than smaller emulation chips because they are produced at a lower yield. Very often, the resulting increase in performance that accompanies a larger emulation chip, i.e., an emulation chip containing more processors, is cost-prohibitive.

Thus, there is a need in the art for an emulation chip that contains an increased number of processors that is not cost-prohibitive.

SUMMARY OF THE INVENTION

The present invention generally relates to an improved processor-based emulation chip. The apparatus is a processor-based hardware emulation chip element comprising a plurality of discrete hardware emulation chips (discrete integrated circuits) and a crossbar for coupling data between the plurality of hardware emulation chips. The method comprises providing data to a crossbar from a first discrete emulation chip, selecting the data from the crossbar using a second discrete emulation chip, and storing the data in a data array in the second discrete emulation chip.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

While the invention is described herein by way of example using several embodiments and illustrative drawings, those skilled in the art will recognize that the invention is not limited to the embodiments of drawing or drawings described. It should be understood that the drawings and detailed description thereto are not intended to limit the invention to the particular form disclosed, but on the contrary, the invention is to cover all modification, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION

The present invention is a method and apparatus for coupling data between discrete emulation integrated circuits (emulation chips). More specifically, an improved processor-based emulation circuit comprising a plurality of discrete emulation chips is described.

Figure 1:
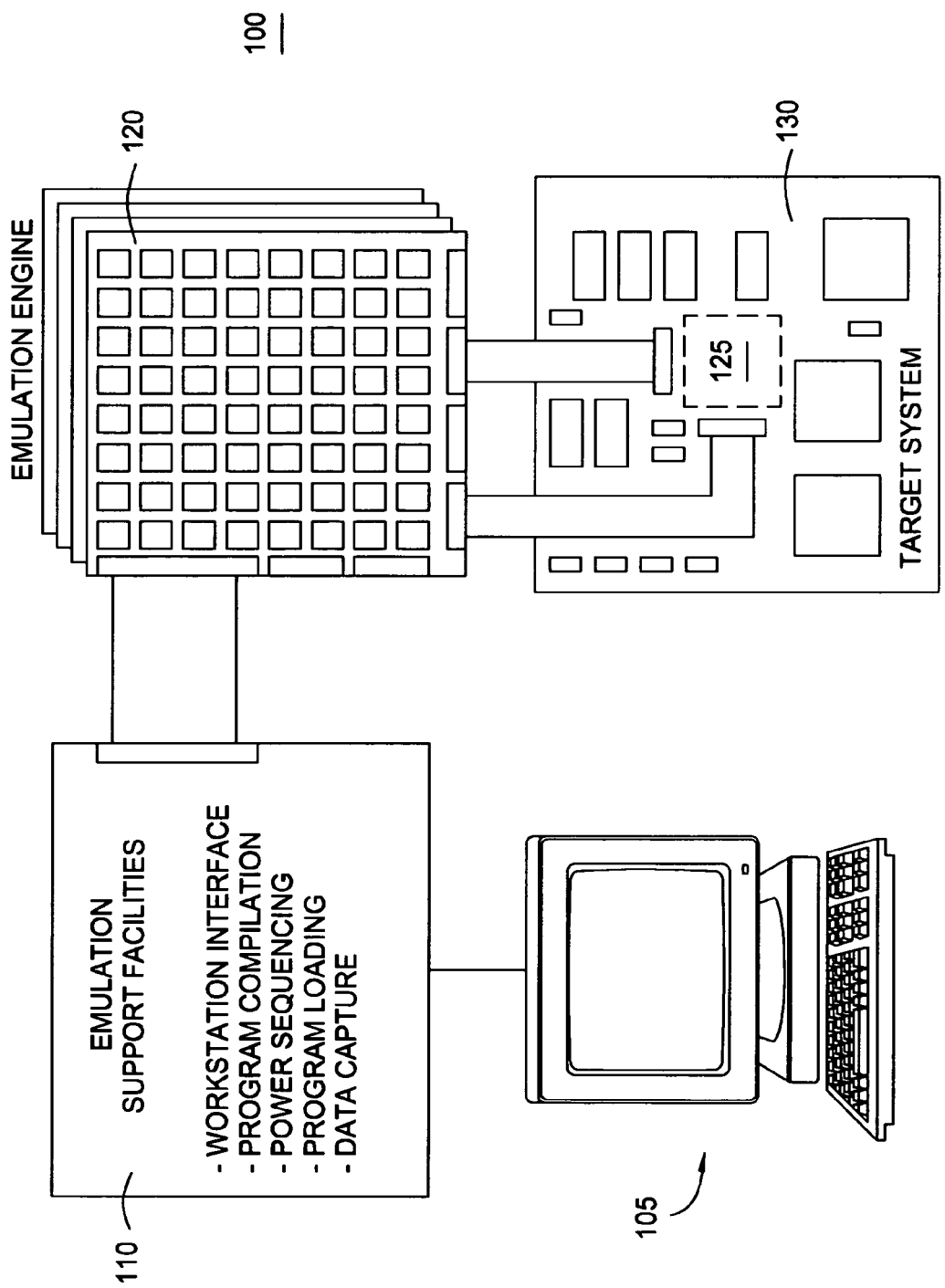
FIG. 1 is an overview of an emulation system.

FIG. 1 is an overview of an emulation system 100. The system comprises a computer workstation 105, emulation support facilities 110, an emulation engine 120 and a target system 130. The computer workstation 105 is coupled to the emulation support facilities 110. The computer workstation 105 allows a user to interface with the emulation engine 120, control the emulation process and collect emulation results for analysis. The emulation support facilities 110 provide a workstation interface, program compilation, power sequencing, program loading and data capture. Under control of the computer workstation 105, programming information and data is loaded to the emulation engine 120 from the support facilities 110.

In response to the programming received from the emulation support facilities 110, the emulation engine 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
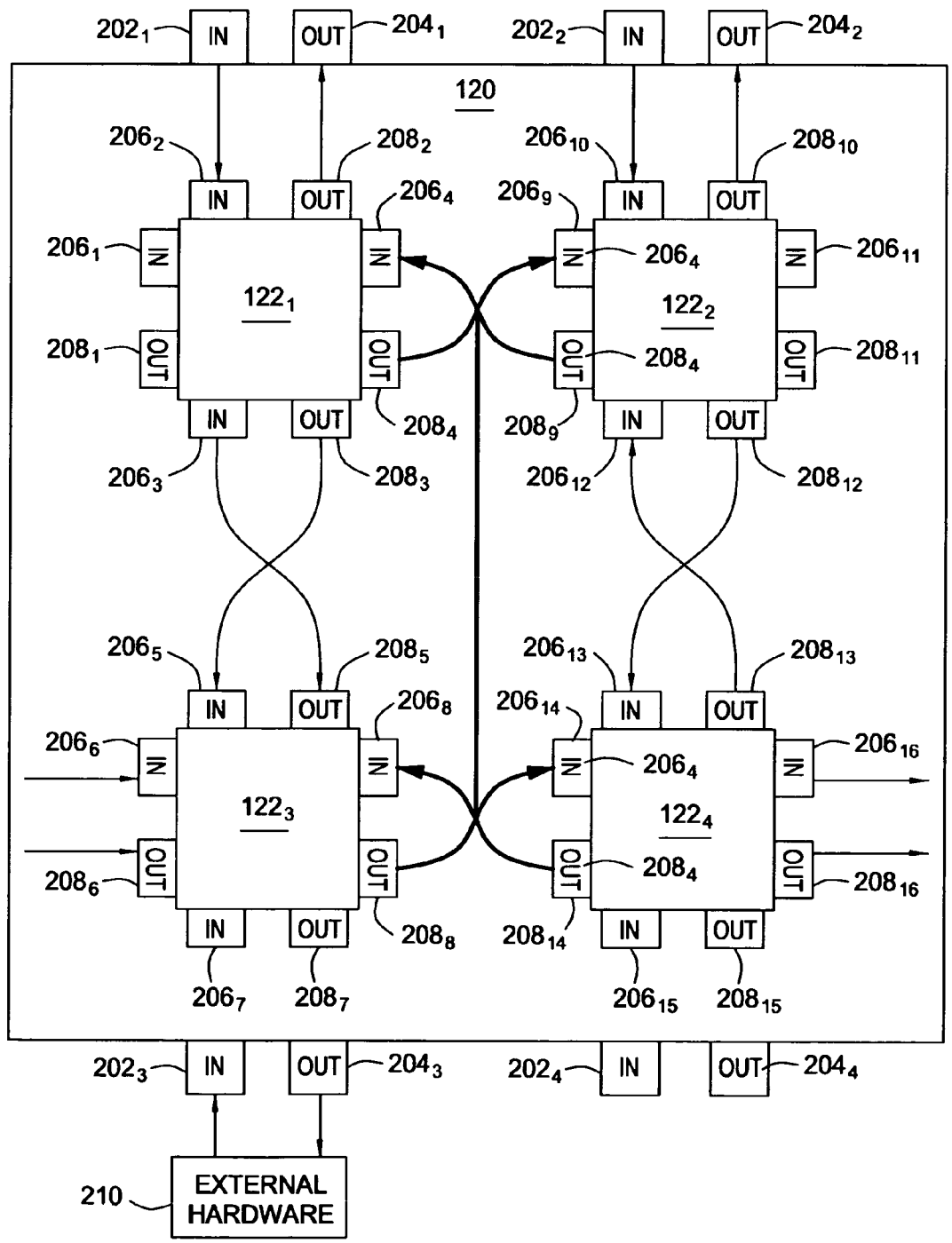
FIG. 2 is an overview of an emulation board.

FIG. 2 is a block diagram of an emulation board 120. The emulation board 120 is comprised of individual emulation circuit groups $122_1$ to $122_4$ (collectively 122). The emulation board 120 has board inputs $202_1$ to $202_4$ (collectively 202) and board outputs $204_1$ to $204_4$ (collectively 204). The board inputs 202 and outputs 204 allow the emulation board 120 to connect to other emulation boards (not shown) and to external hardware 210. The external hardware 210 may be a VLSI circuit, a debugger, a memory, or any combination of hardware and software from which the emulation circuit group 122 can benefit.

Each emulation circuit group 122 has multiple inputs $206_n$ and multiple outputs $208_n$ (where n is an integer). The outputs 208 of each emulation circuit group 122 connect directly to the inputs 206 of the other emulation circuit groups 122 present on the emulation board 120.

Figure 3:
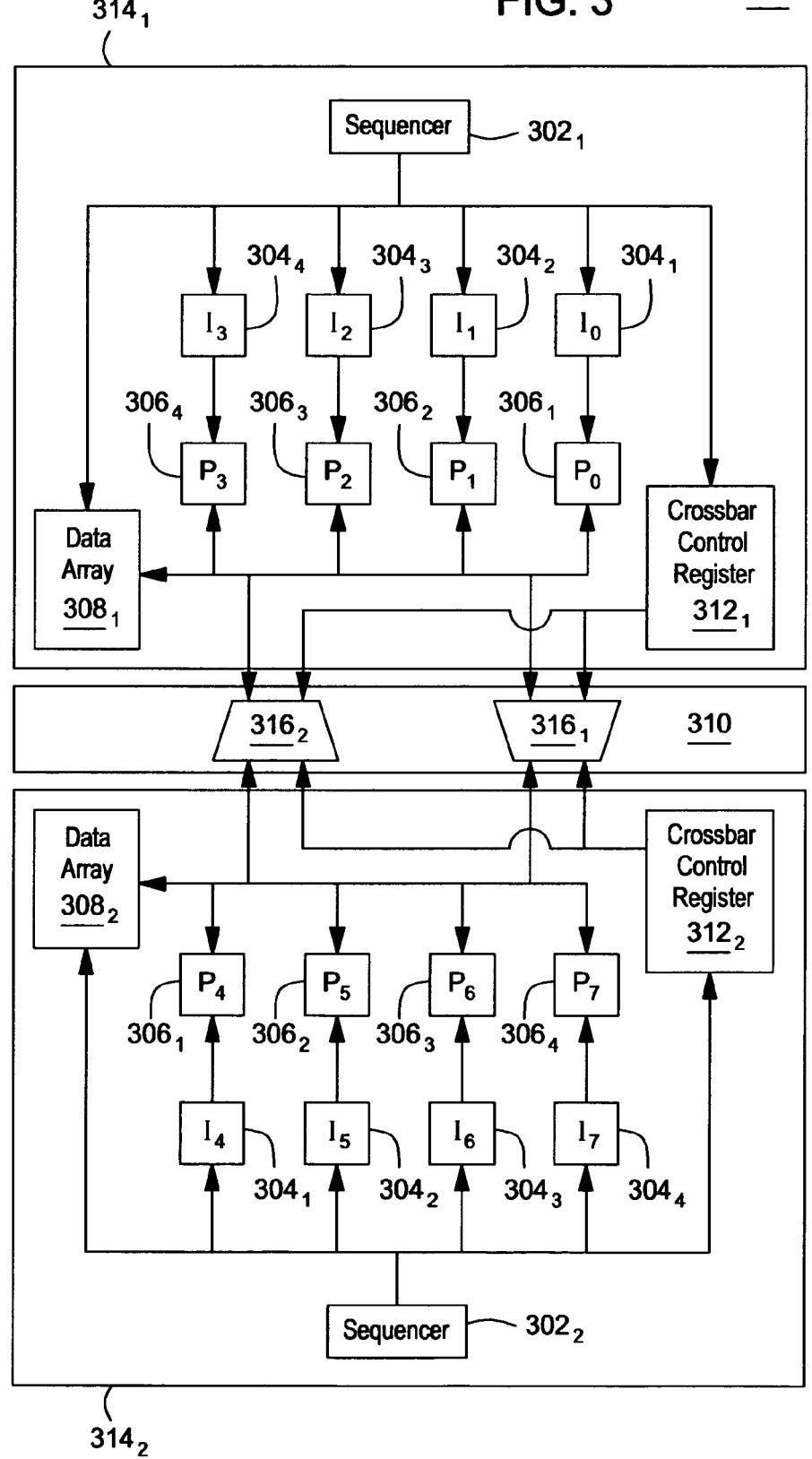
FIG. 3 is a block diagram of one embodiment of an emulation circuit element.

FIG. 3 is a block diagram of an emulation circuit element 300. Each emulation circuit group 122 (shown in FIG. 2) comprises multiple emulation circuit elements 300. In one embodiment of the invention, the emulation circuit element 300 is comprised of two individual emulation chips $314_1$ and $314_2$ (collectively 314) connected by a crossbar 310. In an alternative embodiment of the invention, the emulation circuit element 300 is comprised of three or more emulation chips similar to emulation chips $314_1$ coupled together by one or more crossbars similar to the crossbar 310. The present invention contemplates an emulation circuit element 300 comprising two or more emulation chips 314 coupled together by a crossbar 310. Each emulation chip 314 is comprised of processors $306_n$, instruction memories $304_n$, a sequencer $302_n$, a data array $308_n$, and a crossbar control register $312_n$ (where n is an integer).

As depicted in FIG. 3, emulation chip $314_1$ is a mirror image of emulation chip $314_2$. Each of the processors 306 within the emulation chips 314 are connected to each other in parallel, i.e., the output of each processor 306 is available as an input to another processor 306 within the emulation chip 314. The processors 306 are also coupled to the crossbar 310 and their associated data arrays 308. The output of each processor 306 is provided to the crossbar 310 and the associated data array 308. By coupling a plurality of processors in this manner, an L×M processor (where L equals the number of processors per integrated circuit and M equals the number of integrated circuits) integrated circuit is manufactured without the yield issues associated with fabricating a single large processor integrated circuit. The instruction memories 304 are coupled to a specific processor 306 on the emulation chip 314 and provide instructions words to their associated processor 306. The sequencer 302 is coupled to the instruction memories 304, the data array 308 and the crossbar control register 312.

In one embodiment of the invention, each emulation chip 314 that comprises the emulation circuit element 300 is identical, i.e., the emulation chips 314 have the same number of processors 306 and instruction memories 304 and the data arrays 308 are of equal depth. The emulation chips 314 that comprise the emulation circuit element 300 communicate with each other via the crossbar 310.

The processors 306 are a fundamental component of the emulation circuit element 300. The processor's primary function is to execute an N-input logical function (where N is an integer) and produce a function bit out. The inputs for each logic function can be selected from a variety of sources, including bits stored from a previous operation, or from another one or more processors 306. The resulting function bit out may correspond to any one of: a logic gate output of the emulated design, a register output of the emulated design, a synthesized intermediate logic state, or a control bit generated for the emulation process.

The instruction memories 304 are comprised of individual instruction slots selectable by a read address; each instruction slot contains an instruction word. Each instruction slot is consecutively numbered from 0 to a maximal number that reflects the capacity of the instruction memory 304. Each instruction word is evaluated by the processor 306 associated with that particular instruction memory 304.

The data arrays 308 are memories that store the output of the processors 306. The write address for the data array 308 is provided by the sequencer 302. Each data array 308 has n write ports, where n is equal to the number of processors 306, and n×y read ports, where n is equal to the number of processors 306 and y is equal to the number of inputs into each processor 306. Each processor 306 is capable of accessing data stored in the data array 308 by another processor 306 during one emulation cycle.

The sequencer 302 is connected to the data array 308, the instruction memories 304, and the crossbar control register 312. The sequencer 308 provides timing information to the emulation chip 314, provides sequential write addresses to the data array 308, causes the instruction memories 304 to sequentially output instruction words to their associated processors 306 and the crossbar control register 312 to sequentially output control bits to the crossbar 310. The instruction words control the operation of their respective processors and the control bits are used to select data from the crossbar 310. Each increment of the sequencer 302 causes the step value to advance from zero to a predetermined maximum value and corresponds to one design path clock cycle for the emulated design.

The crossbar 310 allows communication between the two emulation circuits 314 that comprise an emulation circuit element 122. The crossbar 310 is controlled by control bits provided by the crossbar control register 312.

In one embodiment of the invention, the crossbar 310 is comprised of multiplexers $316_1$ and $316_2$ (collectively 316). Each multiplexer 316 is N×1 inputs wide, where N is equal to the number of processors in the emulation chip 314. The multiplexers 316 receive the output produced by the processors 306 and control bits provided by the crossbar control register 312. The control bits provided by the crossbar control register 312 are used to select the output of the multiplexers 316, i.e., select an output from a particular processor 306 to couple to the data array 308 in another emulation chip 314. More specifically, multiplexer $316_1$ is under the control of crossbar control register $312_2$ to select an output bit from one processor $306_1$ to $306_4$, to be coupled to the data array $308_2$. Similarly, multiplexer $316_2$ is under the control of crossbar control register $312_1$ to select an output bit from one processor $306_1$ to $306_4$, to be coupled to the data array $308_1$.

The crossbar control register 312 stores control bits used to select an output from the crossbar 310. The control bits determine whether the output is provided to an internal data array, i.e., the data array 308 within the same emulation chip 314, or to an external data array, i.e., the data array 308 on the other emulation chip 314 that comprises the emulation circuit element 300.

Figure 4:
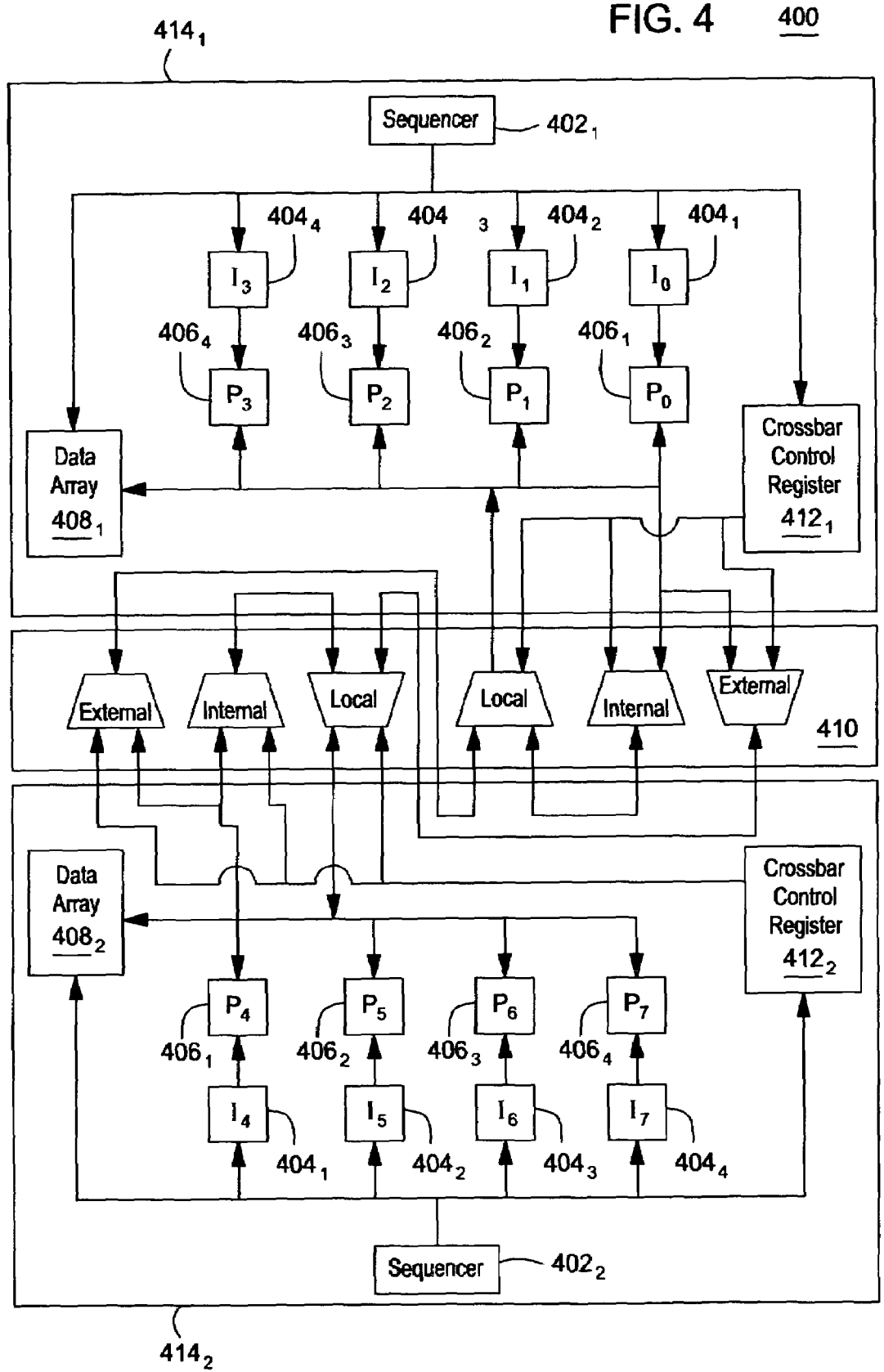
FIG. 4 is a block diagram of an alternative embodiment of a crossbar.

FIG. 4 is a block diagram of an alternative embodiment of a crossbar 400. The crossbar 400 may replace crossbar 310 used by emulation circuit element 300 (shown in FIG. 3).

In this alternative embodiment of the invention, the crossbar 410 comprises a series of multiplexers: external data multiplexers $416_1$ and $416_2$ (collectively 416), internal data multiplexers $418_1$ and $418_2$ (collectively 418), and data array input selection multiplexers $420_1$ and $420_2$ (collectively 420).

The internal data multiplexers 418 and external data multiplexers 416 receive as input the output produced by the processors 306 and control bits from the crossbar control register 312. The control bits provided by the crossbar control register 312 are used to select the output of the internal data multiplexers 418 and external data multiplexers 416. The crossbar control register 312 stores control bits used to select an output from the crossbar 400. The control bits determine whether the output is provided to an internal data array 308 via an internal data multiplexer 418, i.e., a data array 308 within the same emulation circuit 314, or to an external data array 308 via an external data multiplexer 416, i.e., a data array 308 on the other emulation chip 314 that comprises the emulation circuit element 300.

The internal data multiplexer $418_1$ provides its output to the data array input selection multiplexer $420_1$; internal data multiplexer $418_2$ provides its output to the data array input selection multiplexer $420_2$. The output of the data array input selection multiplexers 420 is selected by control bits provided from the crossbar control register 312 to the data array input selection multiplexers 420. The output of the data array input selection multiplexers 420 is provided to at least one of the data arrays 308 within the emulation chip 314.

The external data multiplexer $416_1$ provides its output to the data array input selection multiplexer $420_2$; external data multiplexer $416_2$ provides its output to the data array input selection multiplexer $420_1$. The output of the data array input selection multiplexers 420 is selected by control bits provided from the crossbar control register 412 to the data array input selection multiplexers 420. The output of the data array input selection multiplexers 420 is provided to at least one of the data arrays 408 within the emulation chip 314.

Figure 5:
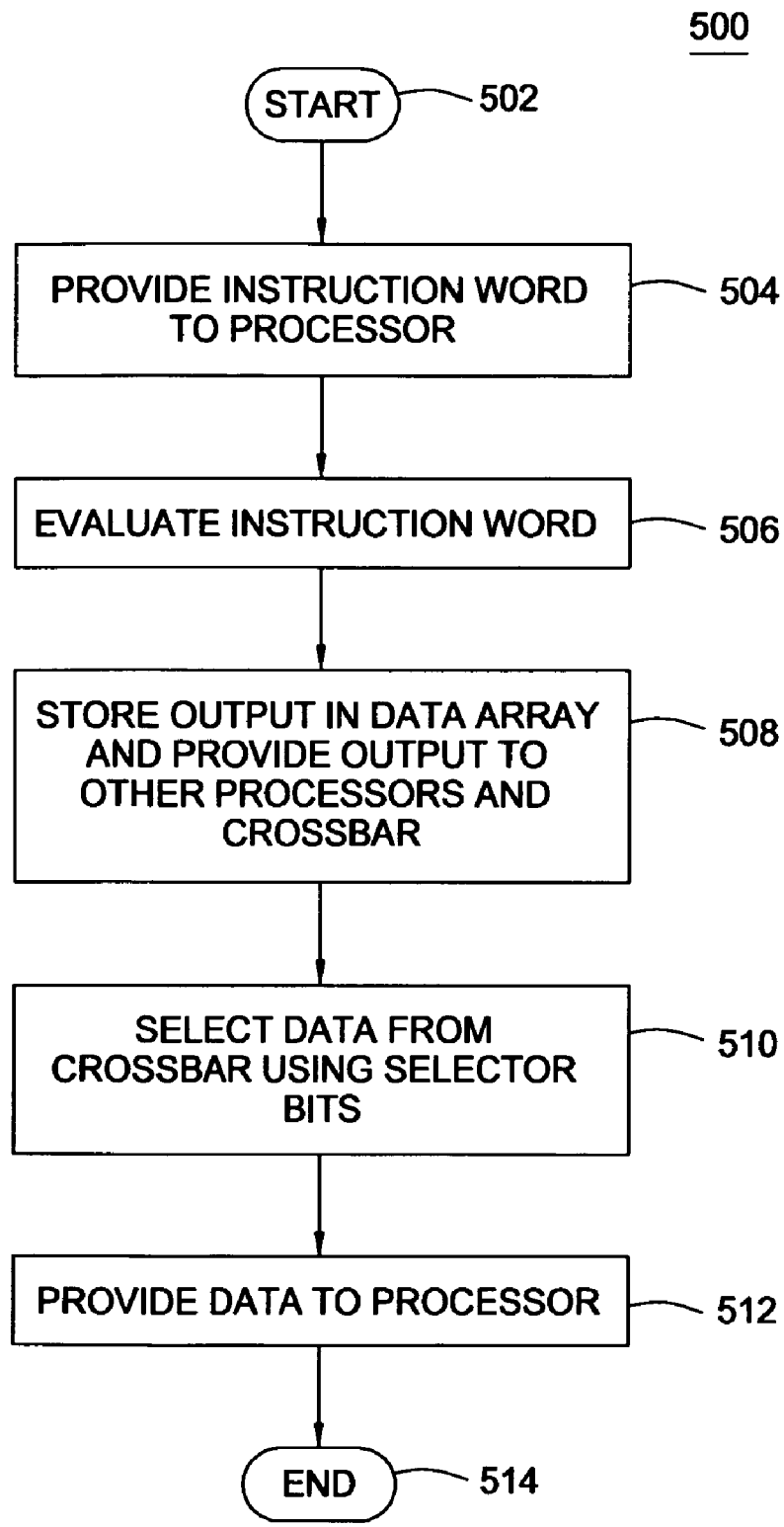
FIG. 5 is a flow diagram of a method that utilizes one embodiment of the present invention.

FIG. 5 is a flow diagram 500 of a method that utilizes one embodiment of the present invention. This method 500 may be used in conjunction with either of the embodiments of FIG. 3 or 4.

The method 500 starts at block 502 and proceeds to block 504. At block 504, an instruction memory 304 provides an instruction word to a processor 306 that is a component of an emulation circuit group 122. The instruction word is selected by a sequencer 302. At block 506, the processor 306 evaluates the instruction word and produces an output bit. At block 508, the processor 306 stores the output bit in a data array 308, and simultaneously provides the output bit to other processors 306 and a crossbar 310/400. At block 510, data is selected from the crossbar 310/400 using control bits provided by a crossbar control register 312. At block 512, the data selected from the crossbar 310/400 is provided to at least one of the data arrays 308 within the emulation circuit element 122. At block 514, a processor 306 selects the stored data from the data array 308. The method 500 ends at 516.

Thus, the present invention provides a method and apparatus for coupling data between multiple, discrete processor-based emulation chips. The processor-based emulation chips are combined to form an emulation circuit element. The emulation circuit element possesses all the functionality of an equivalent size conventional emulation chip. For example, an emulation circuit element comprised of two discrete emulation chips containing four processors each provides all the functionality of a conventional emulation chip that contains eight processors. The emulation circuit element may be produced at a lower cost than an equivalent emulation chip because it is manufactured from higher-yielding, lower cost emulation chips. Thus, the present invention allows the number of processors on an emulation chip, and on an emulation board, to be increased without a substantial increase in cost.

While the foregoing is directed to embodiments of the present invention, other and further embodiments of the invention may be devised without departing from the basic scope thereof, and the scope thereof is determined by the claims that follow.

The invention claimed is:

1. A processor-based hardware emulation circuit apparatus comprising:
    a plurality of discrete hardware emulation chips, each discrete hardware emulation chip comprising:
    a plurality of processors for evaluating data;
    a data array for storing output of the processors; and
    a plurality of instruction memories, each one connected to one processor for providing at least one instruction word to the corresponding processor; and
    one or more crossbars, coupled to the hardware emulation chips, for coupling data between the plurality of hardware emulation chips, wherein the plurality of discrete hardware emulation chips function in combination as a single emulation circuit element.

2. The apparatus of claim 1 where each crossbar further comprises a plurality of multiplexers for selecting data to be coupled between the plurality of discrete hardware emulation chips.

3. The apparatus of claim 2 where the plurality of discrete hardware emulation chips comprises a first emulation chip and a second emulation chip and the plurality of multiplexers comprises a first multiplexer for coupling data from the first emulation chip to the second emulation chip and a second multiplexer for coupling data from the second emulation chip to the first emulation chip.

4. The apparatus of claim 2 where the plurality of discrete hardware emulation chips comprises a first emulation chip and a second emulation chip and the plurality of multiplexers comprises a first internal data multiplexer for coupling a first amount of data to a first data array input selection multiplexer, a first external data multiplexer for coupling a second amount of data to a second data array input selection multiplexer, a second internal data multiplexer for coupling a third amount of data to the second data array input selection multiplexer, and a second external data multiplexer for coupling a fourth amount of data to the first data array input selection multiplexer.

5. The apparatus of claim 2 where the plurality of discrete hardware emulation chips comprises a first emulation chip and a second emulation chip, and each emulation chip comprises a crossbar control register for providing control bits to the plurality of multiplexers.

6. The apparatus of claim 5 where each emulation chip further comprises a sequencer for providing at least one sequential write address to the data array, at least one read address to the at least one instruction memory, and at least one read address to the crossbar control register.

7. The apparatus of claim 5 wherein each crossbar couples output bits from the plurality of processors in a first emulation chip to a data array in a second emulation chip.

8. The apparatus of claim 7 wherein each crossbar further comprises a multiplexer that selects an output bit from one of the plurality of processors in the first emulation chip.

9. The apparatus of claim 8 further comprising a crossbar control register for controlling selection of the output bit from the multiplexer.

10. A method for coupling data between a plurality of discrete processor-based hardware emulation chips in a processor-based hardware emulation circuit, each discrete hardware emulation chip comprising:
   a plurality of processors for evaluating data;
   a data array for storing output of the processors; and
   a plurality of instruction memories, each one connected to one processor for providing at least one instruction word to the corresponding processor; and
   the processor-based hardware emulation circuit further comprising one or more crossbars coupled to the hardware emulation chips, for coupling data between the plurality of hardware emulation chips, the method comprising:
   providing data to a crossbar from a first discrete emulation chip;
   selecting the data from the crossbar using a second discrete emulation chip; and
   storing the data in a data array in the second discrete emulation chip,
   wherein the plurality of discrete hardware emulation chips function in combination as a single emulation circuit element.

11. The method of claim 10 wherein the data comprises output bits of processors within the first discrete emulation chip.

12. The method of claim 10 further comprising providing control bits to the crossbar from a crossbar control register to select the data from the crossbar.

13. The method of claim 10 further comprising using a processor in the second discrete emulation chip to evaluate the data stored in the data array from the first discrete emulation chip.

14. The method of claim 10 wherein the crossbar comprises a first multiplexer for coupling a first amount of data from the first discrete emulation chip to the second discrete emulation chip and a second multiplexer for coupling a second amount of data from the second discrete emulation chip to the first discrete emulation chip and the method further comprises:
   providing control bits from a first crossbar control register to the second multiplexer to select the second amount of data; and
   providing control bits from a second crossbar control register to the first multiplexer to select the first amount of data.

15. The method of claim 14 further comprising:
   storing the first amount of data in the data array in the second discrete emulation chip; and
   storing the second amount of data in a second data array in the first discrete emulation chip.

16. The method of claim 15 further comprising:
   using a processor in the second discrete emulation chip to evaluate the first amount of data stored in the data array from the first discrete emulation chip; and
   using a processor in the first discrete emulation chip to evaluate the second amount of data stored in the second data array in the first discrete emulation chip.

17. The method of claim 10 wherein the crossbar comprises a first internal data multiplexer for coupling a first amount of data to a first data array input selection multiplexer, a first external data multiplexer for coupling a second amount of data to a second data array input selection multiplexer, a second internal data multiplexer for coupling a third amount of data to the second data array input selection multiplexer, and a second external data multiplexer for coupling a fourth amount of data to the first data array input selection multiplexer, and the method further comprises:
   providing control bits from a first crossbar control register to the second data array input selection multiplexer to select between the second amount of data and the third amount of data; and
   providing control bits from a second crossbar control register to the first data array input selection multiplexer to select between the first amount of data and the fourth amount of data.

18. The method of claim 17 further comprising:
   storing the selected amount of data, wherein the selected amount of data is either the second amount of data or the third amount of data, in the data array in the second discrete emulation chip; and
   storing the selected amount of data, wherein the selected amount of data is either the first amount of data or the fourth amount of data, in a second data array in the first discrete emulation chip.

19. The method of claim 18 further comprising:
   using a processor in the second discrete emulation chip to evaluate the selected amount of data stored in the data array from the first discrete emulation chip; and
   using a processor in the first discrete emulation chip to evaluate the selected amount of data stored in the second data array in the first discrete emulation chip.

20. A processor-based hardware emulation circuit element comprising:
   at least one first discrete hardware emulation chip, the first discrete hardware emulation chip comprising:
   a first number of processors for evaluating data;
   a data array for storing output of the processors; and a plurality of instruction memories, each one connected to one processor for providing at least one instruction word to the corresponding processor;

at least one second discrete hardware emulation chip, the second discrete hardware emulation chip comprising:

a second number of processors for evaluating data;

a data array for storing output of the processors; and a plurality of instruction memories, each one connected to one processor for providing at least one instruction word to the corresponding processor; and one or more crossbars, coupled to the hardware emulation chips, for coupling data between the plurality of hardware emulation chips, each crossbar, including a plurality of multiplexers, and coupled to the at least one first and the at least one second discrete hardware emulation chips for coupling data between the at least one first and the at least one second hardware emulation chips, wherein the at least one first and the at least one second hardware emulation chips possess functionality of an equivalent single emulation circuit element having a number of processors equal to the first and second number of processors.

* * * * *